United States Patent [19]

Fong

[11] Patent Number: 5,465,062
[45] Date of Patent: Nov. 7, 1995

[54] TRANSITION DETECTOR CIRCUIT

[75] Inventor: Vincent L. Fong, Fremont, Calif.

[73] Assignee: Rohm Corporation, San Jose, Calif.

[21] Appl. No.: 191,361

[22] Filed: Feb. 3, 1994

Related U.S. Application Data

[63] Continuation of Ser. No. 68,831, May 28, 1993, abandoned, which is a continuation of Ser. No. 806,976, Dec. 12, 1991, abandoned, which is a continuation of Ser. No. 516,751, Apr. 30, 1990, abandoned.

[51] Int. Cl.$^6$ ........................ H03K 3/07; H03K 17/296; H03H 11/26
[52] U.S. Cl. ........................ 327/172; 327/176; 327/263; 327/264; 327/393; 327/395; 327/400
[58] Field of Search ........................ 307/594, 595, 307/597, 602, 603, 605, 265, 272.1, 269, 601, 471, 265, 266, 267; 328/55, 58, 66, 63, 60, 61, 104; 327/31, 261, 264, 285, 288, 395, 400

[56] References Cited

U.S. PATENT DOCUMENTS

| | | | |
|---|---|---|---|
| 3,663,883 | 5/1972 | Olso | 328/72 |
| 3,713,145 | 1/1973 | Butler et al. | 307/273 |
| 3,772,534 | 11/1973 | Dellecave et al. | 307/273 |
| 4,583,008 | 4/1986 | Grugett | 307/265 |
| 4,675,546 | 6/1987 | Shaw | 307/602 |
| 4,710,653 | 12/1987 | Yee | 307/603 |
| 4,719,365 | 1/1988 | Misono | 307/269 |
| 4,730,347 | 3/1988 | Paul | 328/63 |
| 4,742,248 | 5/1988 | Smith et al. | 307/273 |
| 4,746,819 | 5/1988 | Kashiwagi | 307/273 |
| 4,797,585 | 1/1989 | Segawa et al. | 307/594 |
| 5,172,397 | 12/1992 | Llewellyn | 307/269 |
| 5,264,737 | 11/1993 | Oikawa | 307/265 |
| 5,268,594 | 12/1993 | Huang | 307/265 |

*Primary Examiner*—Timothy P. Callahan
*Assistant Examiner*—Trong Phan
*Attorney, Agent, or Firm*—Limbach & Limbach

[57] ABSTRACT

A transition detection circuit is provided comprising input means receiving the signal to be monitored for generating a first pulse having a first predetermined pulsewidth when a transition occurs in the signal being monitored; and output means responsive to the first pulse from the input means for generating a second pulse having a second predetermined pulsewidth which is less than the first predetermined pulsewidth. The present invention permits a large number of signals to be monitored for transition yet provide a highly precise output pulsewidth, all with a minimum of circuitry. Preferably the input means include a plurality of input channels, each channel being assigned to a different signal being monitored and each channel providing the first predetermined pulsewidth using simple, non-precision time delay circuits. The output state employs a single, high precision time delay circuit to provide the second predetermined pulsewidth.

24 Claims, 4 Drawing Sheets

FIG. 6 and the other a version of the input signal 20 which has been delayed by an interval $\tau_1$. When a transition is first presented

TRANSITION DETECTOR CIRCUIT

This is a continuation of application Ser. No. 08/068,831 filed on May 28, 1993 abandoned, which was a continuation of application Ser. No. 07/806,976 filed on Dec. 12, 1991 abandoned, which was a continuation of application Ser. No. 07/516,751 filed on Apr. 30, 1990 abandoned.

TECHNICAL FIELD

The present invention is directed to circuitry for detecting transitions in digital signals; and more particularly to such transition detecting circuitry which provide an output pulse having a precise pulsewidth.

BACKGROUND ART

Figure 1:
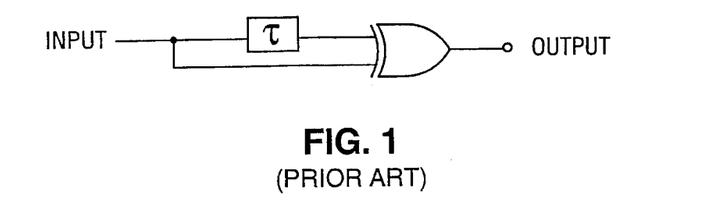
FIG. 1 is a simplified schematic of a conventional transition detection circuit.

Transition detectors for detecting the presence of a transition in input or address signals have been widely used by designers to enhance circuit design performance. Simply stated, such transition detectors provide a pulse output having a predetermined duration whenever a transition is detected in a digital signal. One common implementation of such a circuit utilizes an exclusive-OR (XOR) logic gate and a time delay block, as shown in FIG. 1.

As a matter of background, the output of an exclusive-OR gate is a logic 1 when its inputs are at different logic states, and a logic 0 when its inputs are the same logic state. In the circuit of FIG. 1, one of the inputs of the exclusive-OR gate receives directly the signal being monitored. The other input receives the signal being monitored through the time delay block. The time delay block delays the signal by an amount $\tau$. When a transition initially occurs in the signal being monitored, the inputs to the exclusive-OR gate have different logic states and the output of the exclusive-OR gate is a logic 1. After a time $\tau$, the inputs of the exclusive-OR gate attain the same logic value and the output of the exclusive-OR gate changes to a logic 0. This produces an output pulse having a pulsewidth $\tau$, which begins when the transition in the input signal first occurs.

In the past the time delay, $\tau$, has been generated using an integrated resistance and capacitance that provided an RC time constant.

One disadvantage of previous circuits of this type is the difficulty in controlling the time delay period due to variations in process and operating conditions. The duration of the time delay often varied unacceptably. Further, for most applications, it is desireable to have the length of the time delay related to propagation delays in other parts of the system in which the circuit is to be used. Typically, such a time delay would desirably vary in the same manner as the propagation delays varied over temperature, processing variations, and circuit aging. As such, it can be appreciated that prior transition detector circuits leave much to be desired.

SUMMARY OF THE INVENTION

The above and other problems and disadvantages of previous transition detection circuits are overcome by the present invention comprising input means receiving the digital signal to be monitored for generating a first pulse having a first predetermined pulsewidth when a transition occurs in the digital signal; and output means responsive to the first pulse from the input means for generating a second pulse having a second predetermined pulsewidth which is less than the first predetermined pulsewidth.

In the typical application of such a circuit, a plurality of input means are used, and only a single output means is needed. The circuit which sets the pulsewidth for the input means can be a simple time delay circuit with no critical electrical requirements other than a duration longer than the duration of the second predetermined pulsewidth. On the other hand, the second predetermined pulsewidth is provided by a circuit which would generate as closely as possible the time delay desired. In this manner, transitions in a multiplicity of signals can be monitored, and a precise output pulsewidth can be provided, and all of this implemented with a minimum of circuitry.

It is therefore an object of the present invention to provide a circuit which detects transitions in a digital signal and which generates a single controllable pulse when such a transition is detected.

It is another object of the present invention to provide a transition detection circuit which provides an output pulse having a precision pulsewidth which depends on only one control element for such precision.

It is still another object of the present invention to provide a transition detection circuit which uses a minimum number of transistors and device elements for implementation.

These and other objectives, features and advantages of the present invention would be more readily appreciated upon consideration of the following detailed description and accompanying drawings.

DETAILED DESCRIPTION OF THE INVENTION

Figure 2:
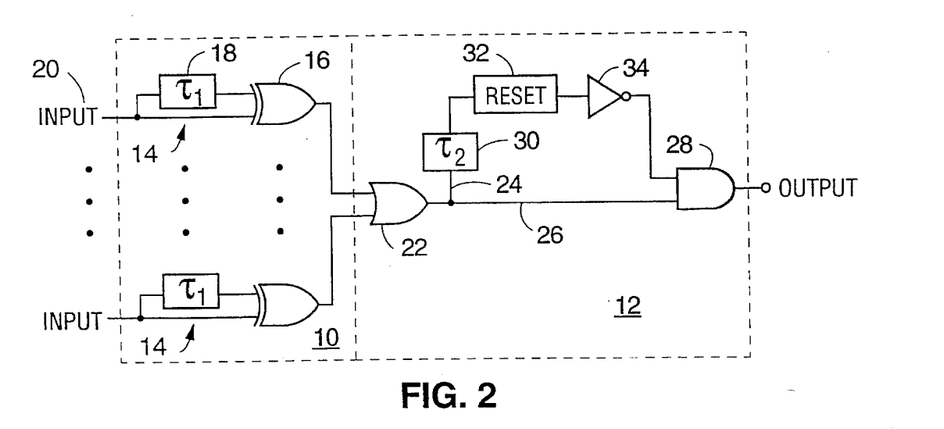
FIG. 2 is a simplified schematic diagram of the present invention.

The preferred characteristic of an address transition detector is as follows: as soon as a input transition is detected, the output of the address transition detector circuit should go to a logic 1 state. After a desired time delay, $\tau$, the output of the address transition detector should go to a logic 0. In the circuit of FIG. 2, a logic 1 output state is provided as soon as a transition is detected in the input signal and the output returns to a logic 0 state after a time $\tau_2$ following the transition in the input signal. The circuit of FIG. 2 is formed of two sections: 1) an input stage 10 and 2) an output stage 12. The input stage 10 has several input channels 14, one input channel for each signal being monitored for transitions.

Each channel includes an exclusive-OR gate 16, and a time delay circuit 18. Each input channel 14 is similar in function to the conventional address transition detection circuitry, see FIG. 1. As described earlier, the exclusive-OR gate 16 receives two inputs, one the actual input signal 20, and the other a version of the input signal 20 which has been delayed by an interval $\tau_1$. When a transition is first presented in the input signal 20, the output of exclusive-OR gate 16 goes from a logic 0 to a logic 1 state. When the delayed version of the input signal 20 reaches the other input of exclusive-OR gate 16, the output of exclusive-OR gate 16 goes from a logic 1 state to a logic 0 state.

Each of the outputs of each of the channels 14 from input stage 10 are applied to a multi-input OR gate 22 in output stage 12. The output of OR gate 22 supplies a signal to two separate paths 24 and 26. AND gate 28 receives the signals which have propagated along paths 24 and 26. The signal along path 26 is applied without delay to AND gate 28, however, the signal propagating along path 24 is delayed by an interval $\tau_2$, provided by delay block 30. The output of delay block 30 is applied to reset block 32. The output of reset block 32 is applied to inverter 34. The output of inverter 34 is then applied to the input of AND gate 28.

In accordance with the present invention, the duration of delay interval $\tau_2$ is less than the duration of delay interval $\tau_1$.

Reset block 32 operates as a latch and is triggered on each edge of the signal from delay block 30.

Figure 5:
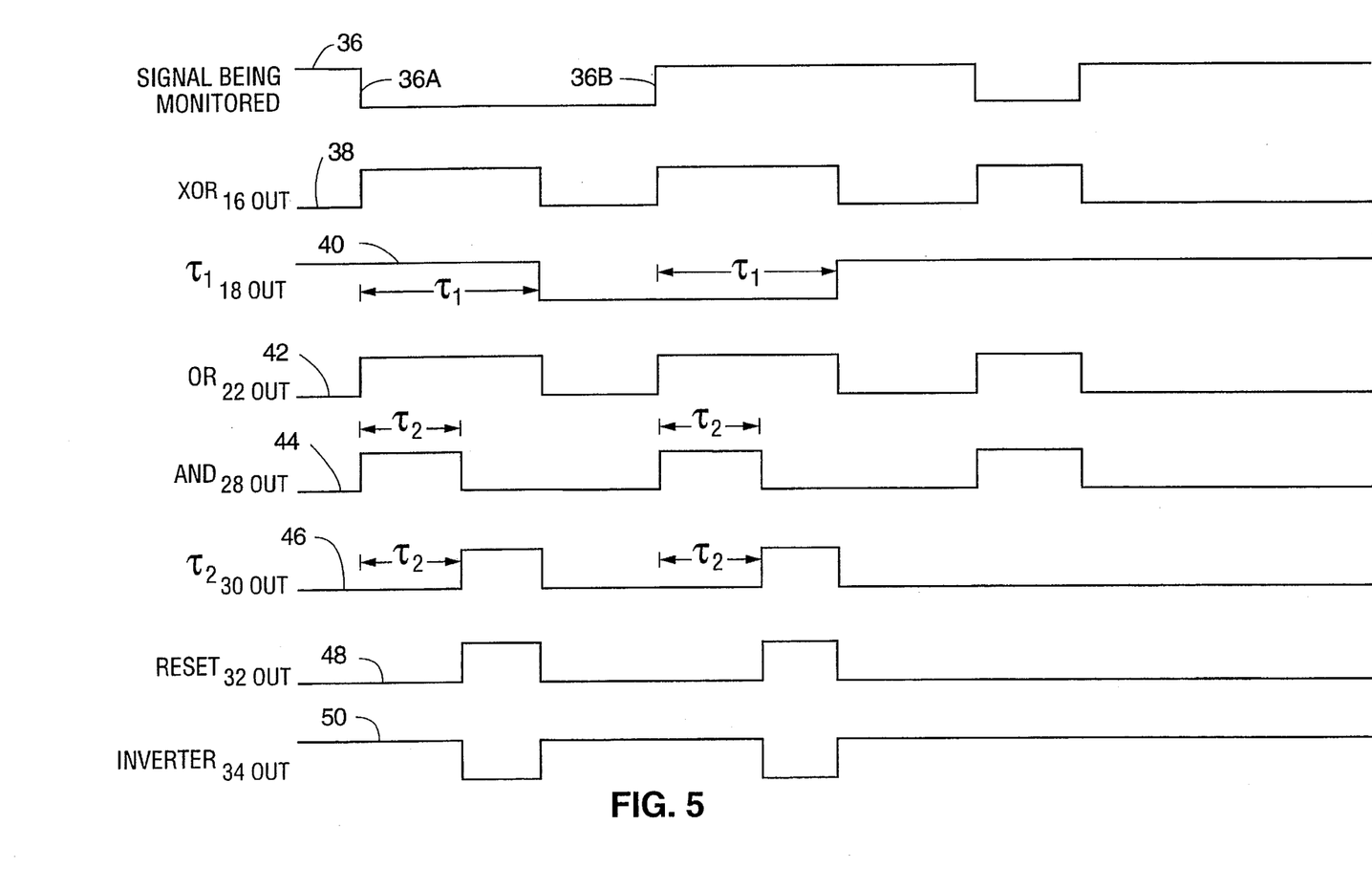
FIG. 5 is a timing diagram for the circuit of FIG. 2.

Referring to FIG. 5, a timing diagram of the operation of the circuit of FIG. 2 is provided. In FIG. 5, waveform 36 represents one of the input signals 20 being monitored for transitions. Waveform 38 represents the output of exclusive-OR gate 16, waveform 40 represents the output of delay block 18, and waveform 42 represents the output of OR gate 22. Waveform 44 represents the output of AND gate 28, the output of the address transition detector circuit, waveform 46 represents the output of delay block 30, waveform 48 represents the output of reset block 32, and waveform 50 represents the output of inverter 34.

When a transition 36a occurs in the signal being monitored 36, the output of exclusive-OR gate 16 goes to a logic 1 state. No immediate change occurs in the output of delay block 18, i.e., waveform 40. The output of OR gate 22 changes immediately to a logic 1. At that point in time, the output of reset circuit 32 (waveform 48) is at a logic 0 so that the output of inverter 34 (waveform 50) is at a logic 1. The change of the output of OR gate 22 to a logic 1 state causes the output of AND gate to go to a logic 1 state, thus representing the start of the output pulse (waveform 44). No immediate change occurs in the output of delay block 30.

However, after an interval $\tau_2$, the output of delay block 30 changes from a logic 0 state to a logic 1 state. This causes the output of reset block 32 to go to a logic 1 state (waveform 48) and the output of inverter 34 to go to a logic 0 state (waveform 50). This causes the output of AND gate to go to a logic 0 state, thus ending the pulse being provided by AND gate 28 (waveform 44). This pulse thus has an interval having a duration of $\tau_2$.

In the meantime, no change in the output of delay block 18 has yet occurred, the duration $\tau_1$ being longer than the duration $\tau_2$. Finally, at a point $\tau_1$ after the occurrence of transition 36a in the signal being monitored, the output of delay block 18 goes to a logic 0 state (waveform 40). This causes the output of OR gate 42 to go to a logic 0 state. In turn, this causes the undelayed input to AND gate 28 to be set to a logic 0 level. This transition in the output of OR gate 22 from a logic 1 state to a logic 0 state causes the delay block 30 to be reset to a logic 0 state. This change in logic state in delay block 30 causes reset circuit 32 to be reset to a logic 0 state. Hence the output of inverter 34 goes to a logic 1 state. This readies the inputs of AND gate 28 for receipt of the next transition in the signal being monitored.

The next transition occurs at point 36b in waveform 36 of FIG. 5. Transition 36b causes the output of exclusive-OR gate 38 to immediately go to a logic 1 level. In turn, this causes the output of OR gate 22 to go to a logic 1 level. This causes the output of AND gate 28 to go to a logic 1 level.

During this time, the signal from the output of OR gate 22 is propagating through delay block 30. After a time $\tau_2$, the output of delay block 30 changes to a logic 1 state which causes reset block 32 to change to a logic 1 state. The output of inverter 34 thus changes to a logic 0 state and the output of AND gate 28 turns to a logic 0 state, thus ending the pulse being output by the transition detection circuit.

Following this, the signal which was propagating through delay block 18, in the input channel 14, is finally applied to the input of exclusive OR gate 16 after a delay of $\tau_1$. This causes the output of OR gate 22 to change to a logic 0 state, and in turn causes the output of delay block 30 to return to a logic 0 state.

This change to a logic 0 state of delay block 30 causes reset block 32 to change back to a logic state 0 and for the output of inverter 34 to change to a logic 1 state in preparation for the next transition in the signal being monitored.

In the above manner it can be seen that the time delay $\tau_2$ sets the output pulsewidth, while the time delay $\tau_1$, being longer than $\tau_2$, resets the output stage for receipt of the next transition. It can also be seen that there is no critical precision requirement for time delay $\tau_1$. In turn, since only one block is needed to provide a delay of $\tau_2$, the complexity of the circuit needed to provide a precise time delay $\tau_2$ has little impact upon the overall space requirement for the overall circuit.

Thus, in the preferred embodiment of the present invention, where the delay $\tau_2$ is desired to mimic the propagation delay of other circuits in the system in which the transition detection circuit of the present invention is sought to be used, the time delay $\tau_2$ can be provided by reproducing or replicating in the position of time delay block 30, the specific circuit which has the particular propagation delay to be mimicked. For example, if the propagation delay sought to be mimicked is present in a row address decoder circuit, the actual row address decoder circuit can be reproduced in the position of time delay block 30. In this manner, the propagation delay of $\tau_2$ for the transition detection circuit will have precisely the same value as the propagation delay of the actual row address decoder circuits being used in the remainder of the system. The time delay $\tau_2$ will vary in the same manner as the propagation delay of the row address decoder over temperature, process variations, and other environmental factors.

On the other hand, because the only requirement for time delay circuit 18 is that the time delay $\tau_1$ be greater in duration than time delay $\tau_2$, simple circuits having a minimum of components, can be used to implement time delay block 18. It is to be noted that in the typical application there are very many signals in which a transition is sought to be detected. In accordance with the present invention, each of these signals is initially applied to an input channel 14. Therefore, there will be required an equal number of input channels as there are signals to be monitored. However, there need be only a single output stage 12 for the address transition detector circuit of the present invention. Thus, it should be clear that a precise output pulsewidth for the address transition detector circuit can be provided with a minimum amount of circuitry required to implement the overall transition detection circuit of the present invention in such an application.

Figure 3:
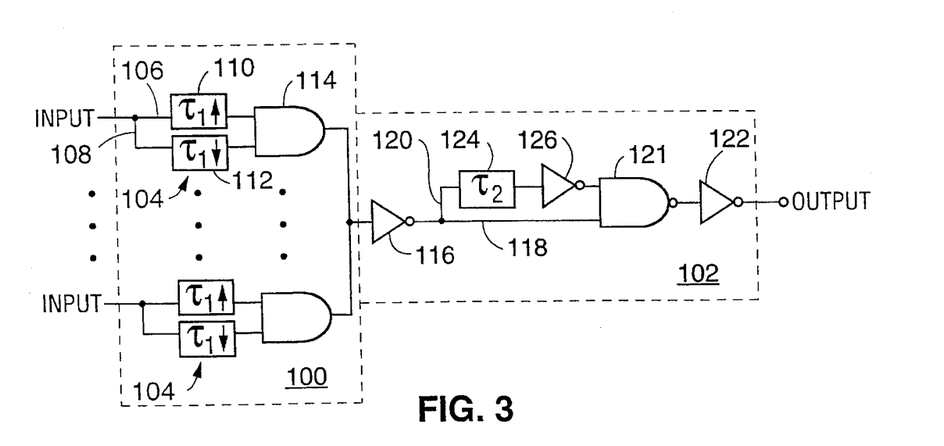
FIG. 3 is a simplified schematic diagram of the preferred embodiment of the present invention.
Figure 4:
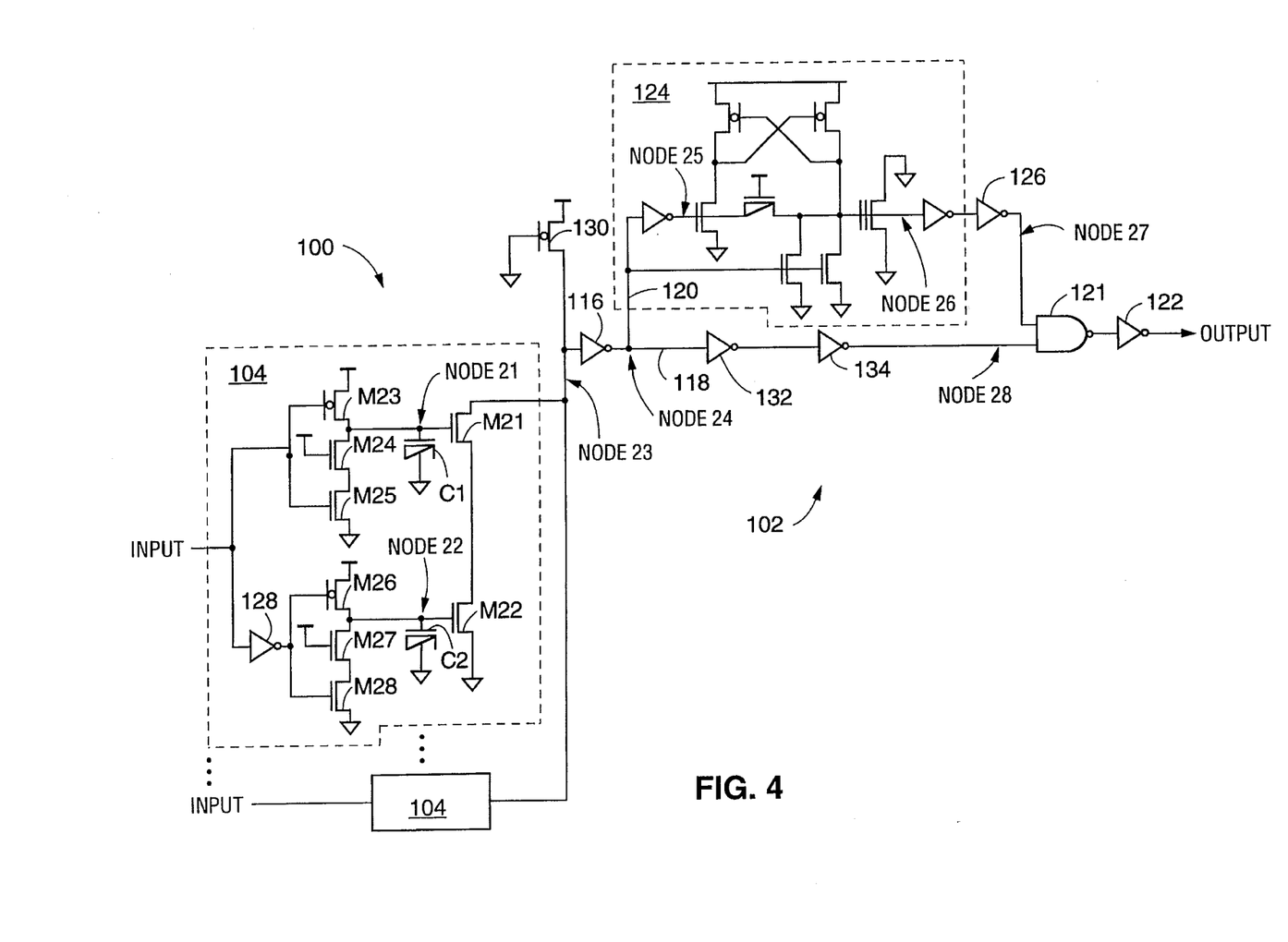
FIG. 4 is a detailed schematic of the preferred embodiment of the present invention showing an example of a circuit block which would provide the desired precision time delay.

Referring now to FIGS. 3 and 4, a preferred embodiment of the present invention will be discussed in detail. FIG. 3 provides a simplified schematic of the detailed circuitry shown in FIG. 4. As was the case with FIG. 2, the preferred embodiment of the present invention includes an input stage 100 and an output stage 102. The input stage can have a large number of individual channels 104 each of which monitors a different signal for transitions. Each channel 103 has associated with it a delay of $\tau_1$. The output stage 102 has a delay associated with it of $\tau_2$.

Each channel 104 includes two signal paths 106 and 108 each signal path 106 and 108 includes a delay block, 110 and 112, respectively, which delays the signals propagating along its associated path by an amount $\tau_1$. The delayed signals are applied to the inputs of an AND gate 114. The output of the AND gate is the output of the channel 104.

Delay block 110 is triggered by a rising edge, while delay block 112 is triggered by a falling edge. Both delay blocks 110 and 112 propagate the compliment edge without delay. For example, delay block 110 upon receipt of a falling edge will propagate that falling edge without delay to the input of AND gate 114. Similarly, delay block 112 will propagate a rising edge without delay to the input of AND gate 114.

Output stage 102 of FIG. 3, includes an inverter 116 which receives the outputs of all of the channels 104. The output of inverter 116 is applied to two signal paths, an undelayed path 118 and a delayed path 120. These signals propagating along paths 118 and 120 are applied to the inputs of a NAND gate 121. The output of NAND gate 121 is inverted by inverter 112 which provides the output of the circuit.

The signal propagating along path 118 is applied directly to one input of NAND gate 121. On the other hand, the signal propagating along path 120 is delayed by delay block 124, and the output of delay block 124 is inverted by inverter 126. Delay block 124 provides a delay interval of $\tau_2$ which is smaller in duration than the interval $\tau_1$, provided by delay blocks 110 and 112 of the input stage.

Referring now to FIG. 4, the detailed implementation of the circuit of FIG. 3 will now be discussed.

With respect to the input stage channels 104, AND gate 114, FIG. 3, is formed by stacking n-channel transistors, M21 and M22. The drain of transistor M21 is connected to the input of inverter 116 in the output stage 102. The source of transistor M21 is connected to the drain of transistor M22 and the gate of transistor M21 operates as an input to the AND gate. The source of transistor M22 is connected to the circuit ground and the gate thereof acts as the other input to the overall AND gate structure.

Delay block 110 is implemented by p-channel transistor M23, and n-channel transistors M24 and M25, as well as capacitor C1. Transistors M23, M24 and M25 are stacked, so that transistor M23 conducts when the signal supplied to its gate falls below a threshold voltage. Transistor M25 conducts when the signal supplied to its gate rises above its threshold voltage. The threshold voltage of transistors M23 and M25 is typically one volt.

Transistor M24 and capacitor C1 provide a discharging RC time constant which is used to set the time delay $\tau_1$. The conductivity of transistors 23 and 25 is high compared to that of transistor M24, preferably one hundred times higher. When the signal being received from the line being monitored is low, transistor 25 does not conduct, but transistor 23 does. This causes capacitor Cl to quickly charge to a voltage near the power supply voltage. When the signal applied to the gates M23 and M25 is high, transistor M23 shuts off but transistor M25 conducts. Since the conductivity of transistor M24 is lower than that of transistors M23 and M25, its conductivity in combination with the value of capacitance C1 determines the RC time constant at which capacitor C1 is discharged.

When capacitor C1 has a voltage greater than the threshold of transistor M21, transistor M21 conducts current between its drain and source. On the other hand, when capacitor C1 is discharged below the threshold voltage of transistor M21, transistor M21 will no longer conduct current. Because of the discharge RC time constant for discharging C1, there will be a delay between the receipt of a positive going transition at the gates of transistors M23 and M25, and the turning off of transistor M21. This delay is the delay $\tau_1$ referred to hereinabove.

In the preferred embodiment of the present invention, the value of capacitance C1 is selected to be at least 10 times the value of the parasitic capacitance of node 21. Once the capacitance of C1 is selected, the conductivity of transistor M24 can then be determined given the desired amount of delay $\tau_1$. For example, capacitors C1 and C2 can have a value of around 0.5 picofarads, transistors M24 and M27 can have a resistivity of 2MΩ, for a time delay $\tau_1$, of 1 μsec.

Delay block 112 is implemented in a similar manner to that of delay block 110. Transistors M26, M27 and M28 are stacked, transistor M26 being a P-channel type while transistors M27 and M28 are N-channel types. Capacitor C2 and transistor M25 provide an RC discharge time constant which sets the time delay $\tau_1$ through the signal path. As was the case with transistors M23 and M25, transistor M26 operates at a charging current-source while transistor M28 operates as a discharging current-sink, with the conductivity of transistor M27 and the capacitance of capacitor C2 determining the rate at which capacitor C2 is discharged. The signal being monitored is first inverted by inverter 128 before being applied to the gates of transistor M26 and M28. This causes the circuitry to provide a delay on the negative edge of the waveform being monitored. The capacitance of capacitor C2 and the conductivity of transistor M27 is selected relative to parasitic capacitance of node 22 and the desired time delay $\tau_1$ as above.

In operation, capacitor C1 is charged quickly to a voltage near the supply voltage following a negative going transition in the signal being monitored, and is discharged through an RC time constant following a positive transition in the signal to be monitored. Conversely, capacitor C2 is quickly charged to near the supply voltage following the presence of a positive going transition in the signal being monitored, but is discharged through an RC time constant following a negative going transition in the signal being monitored. When both capacitor C1 and C2 have a voltage above the threshold voltages of M21 and M22, typically one volt, current will be permitted to flow through transistors M21 and M22, i.e., into node 23. When the voltage on either capacitor C1 or C2 falls below the threshold voltage of its associated transistor (M21 or M22) current will cease to flow through transistors M21 and M22. Preferably the conductivity of transistors M21 and M22 is selected to be at least 10 times that of P-channel transistor 130 in the output stage 102 so that, once current begins to flow through transistors M21 and M22, the voltage at node 23 will make a quick transition to a logic zero state.

Turning now to the output stage in FIG. 4, transistor 130 operates as a current source to the outputs of each channel 104 in the input stage 100. When no current is flowing in any of the outputs of the channels in the input stage, node 23 is at the supply voltage. Conversely, when current flows into any of the outputs of the channels in the input stage, node 23 will assume a potential near the circuit ground. The signal at node 23 is applied to inverter 116, the same as shown in FIG. 3. In FIG. 4, signal path 118 (FIG. 3) is shown to include two inverters 132 and 134. These inverters do not add appreciable propagating delay to the signals traversing signal path 118. With respect to signal path 120, time delay block 124 is shown implemented using a reproduction of a row decoder circuit. In accordance with the present invention, if it is desired to relate the delay $\tau_2$ to a particular propagation delay in another part of the system, the circuitry in which that propagation delay is found is reproduced in block 124. Thus, in the example of FIG. 4, it was desired to provide a time delay $\tau_2$ which mimics the propagation delay through row decoder circuitry. This row decoder circuitry is thus reproduced or replicated in block 124.

The remainder of output stage 102 is as described in connection with FIG. 3.

Figure 6:
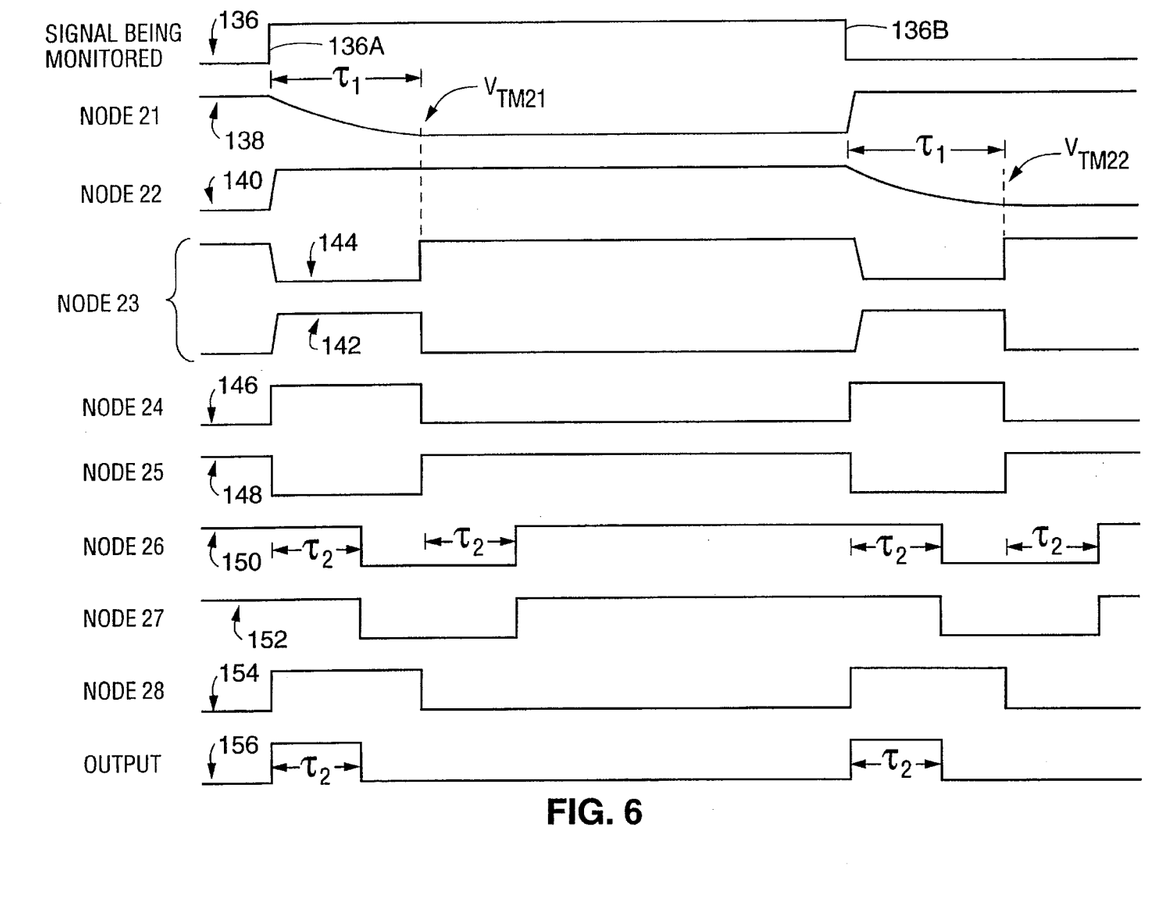
FIG. 6 is a timing diagram for the circuit of FIG. 4.

Referring now to FIG. 6, the timing diagram for the circuit of FIG. 4 is provided.

Waveform 136 is the waveform being monitored for transitions. Waveform 138 is the voltage applied to the gate of transistor M21, hence the voltage on capacitor C1. Waveform 140 is the voltage applied to the gate of transistor M22 and hence the voltage on capacitor C2. Waveform 142 is the current flowing into node 23, i.e., the current flowing through transistors M21 and M22. Waveform 144 is the voltage at node 23.

Waveform 146 is the voltage at node 24, i.e., the output of inverter 116. Waveform 148 is the voltage at node 25, within the time delay block 124.

Waveform 150 is the voltage at node 26, also within time delay block 124. Waveform 152 is the voltage at node 27, i.e., the output voltage of inverter 126. Waveform 154 is the voltage at node 28. Waveforms 152 and 154 represent the inputs to NAND gate 120. Finally, waveform 156 represents the output of the implementation of the present invention in FIG. 4.

From FIG. 6, it can be seen that upon the occurrence of a positive going transition 136*a* and waveform 136, a voltage at node 21 drops towards a logic 0 state according to an RC time constant determined by the conductivity of transistor M24 and the capacitance of capacitor C1. At the same time, a voltage at node 22, i.e., the voltage on capacitor C2, assumes a logic 1 state. Thus, transistor M22 is on and transistor M21 is also initially on. As such, current flows into the node 23 (waveform 142). The voltage at node 23 initially goes low. After a time $\tau_1$, the voltage at node 21 falls below the threshold voltage of transistor M21. At this point, current ceases to flow in transistor M21 and the voltage at node 23 rises quickly toward the power supply voltage.

Upon the occurrence of transition 136*a*, the output of inverter 116 (node 24) went to a logic 1 level. However, once transistor M21 turned off, and the voltage at node 23 rose to the power supply level, the output of inverter 116 reverted to a logic 0 level, see waveform 146. During this time, transistor M22 has been on. When a transition 136*b* occurs in the waveform 136 between a logic 1 level and a logic 0 level, it is capacitor C2 which discharges through an RC time constant. Capacitor C1 is charged quickly to a potential near the power supply voltage. Compare waveforms 138 and 140.

Transistor M21 is on, and transistor M22 also is on as long as the voltage on capacitor C2 (waveform 140) is above the threshold voltage of transistor M22. Once the voltage on capacitor C2 falls below the threshold voltage of transistor M22, transistor M22 ceases to conduct and the voltage on node 23 (waveform 144) moves to a potential near the power supply voltage. This causes inverter 116 to change from a logic 1 output to a logic 0 output. As before, when transition 136*b* first occurred, the output of inverter 116 went from a logic 0 to a logic 1 state. Thus, positive transitions in the signal being monitored are handled by transistors M21, M23, M24 and M25, and capacitor C1, while negative transitions are handled by transistors M22, M26, M27, M28 and capacitor C2.

Moving now to the operation of output stage 102, as shown in waveform 154, the signal along signal path 118 is the non-delayed version of the signal at node 24 (waveform 146).

With respect to signal path 120, delay block 124 has circuitry which provides a propagation delay corresponding to the precise time delay $\tau_2$ sought to be achieved. This is because an exact replica of the circuit for which the propagation delay is sought to be mimicked is reproduced a block 124. Thus, the signal appearing at node 26 (waveform 150) is a version of the signal appearing at node 24 (waveform 146) but delayed by the propagation delay $\tau_2$.

Initially, prior to the receipt of a transition at node 24 (waveform 146), node 27 (waveform 152) is at a logic 1 state. Thus, once the transition at node 24 occurs, node 28 goes to a logic 1 state thereby causing NAND gate to go to a logic 0 state and the output of the transition detector (waveform 156) to go to a logic 1 state. This starts the output pulse of the present invention. When the delayed transition is received at node 27 (waveform 152) at a time $\tau$ later, the output of NAND gate 121 goes to a logic 0.

It is to be noted that after the time delay $\tau_1$ node 24 (waveform 146) returns to a logic 0 state. This causes node 28 (waveform 154) to return to a logic 0 state. A time $\tau_2$ later, node 27 (waveform 152) is returned to a logic 1 state in preparation for the next transition in input signal 136.

In light off,he above, it can be appreciated that the present invention provides a transition detector circuit which is capable of monitoring a large number of signals and providing an output pulse, upon detection of a transition in any one of the signals, having a pulsewidth which is highly precise, all with minimal circuitry. It is also to be understood that the approach of the present invention, to utilize as the precision time delay element a replica of the circuitry to which the time delay is to correspond, provides a precise time delay which retains its precision over temperature, process variations, and other factors.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

I claim:

1. An apparatus for detecting a transition between logic states in a plurality of digital signals comprising a plurality of input means each receiving one of the plurality of digital signals, each for generating a first pulse having a first predetermined pulsewidth when a transition occurs in the digital signal received by the input means;

output means responsive to the first pulse from any one of the input means for generating a second pulse having a second predetermined pulsewidth which is less than the first predetermined pulsewidth.

2. The apparatus of claim 1 wherein the input means comprise first delay means for providing an output which is a version of the digital signal received by the input means that has been delayed by a first predetermined amount of time, $\tau_1$; and first means for comparing the digital signal received by the input means to the output of the first delay means, and for providing a first output logic state when the output and the digital signal received by the input means are the same, and a second output logic state when they are different.

3. The apparatus of claim 2 wherein the output means comprise second delay means for providing an output which is a version of the first pulse which has been delayed by a second predetermined amount of time, $\tau_2$ which is less than $\tau_1$; and second means for comparing the first pulse to the output of the second delay means, and for providing the first output logic state when the output and the first pulse are the same, and a second output logic state when they are different.

4. The apparatus of claim 1 wherein the input means comprise first delay means for providing an output which changes state from a first logic state to a second logic state a first predetermined amount of time, $\tau_1$, after receipt of a rising edge in the digital signal received by the input means, and which changes state from the second logic state to the first logic state without delay upon receipt of a falling edge in the digital signal received by the input means;

second delay means for providing an output which changes state from the second logic state to the first logic state the first predetermined amount of time after receipt of a falling edge in the digital signal received by the input means, and which changes state from the first logic state to the second logic state without delay upon receipt of a rising edge in the digital signal received by the input means; and first means for comparing the outputs of the first and second delay means, and for providing a first output logic state when both outputs are the same predetermined logic state, and a second output logic state when either or both of the outputs are at a logic state different than the predetermined logic state.

5. The apparatus of claim 4, wherein the first delay means each include first capacitor means for storing charge;

first means connected to the capacitor means and responsive to the digital signal received by the input means for charging the capacitor means when the digital signal received by the input means is in the second logic state;

first means connected to the capacitor means and responsive to the digital signal received by the input means for discharging the capacitor means when the digital signal received by the input means is in the first logic state.

6. The apparatus of claim 5, wherein the second delay means each include means receiving the digital signal received by the input means for providing an inverted version of the digital signal received by the input means;

second capacitor means for storing charge;

second means connected to the capacitor means and responsive to the inverted version of the digital signal received by the input means for discharging the capacitor means when the inverted version of the digital signal received by the input means is in the second logic state;

second means connected to the capacitor means and responsive to the inverted version of the digital signal received by the input means for charging the capacitor means with a predetermined time constant when the inverted version of the digital signal received by the input means is in the first logic state.

7. The apparatus of claim 6, wherein the first means for comparing includes first means coupled to the first capacitor means of the first delay means for sinking current from an output node when the first capacitor means is charged above a predetermined voltage; and second means coupled to the second capacitor means of the second delay means for sinking current from the first current sinking means when the second capacitor means is charged above a predetermined voltage, so that both the first and second means for sinking current must be operative before current will flow into the output node.

8. The apparatus of claim 6 wherein the apparatus has a power supply rail and a ground rail, and further wherein the first and second means for charging each comprise a first transistor having a source connected to the power supply rail, a drain, and a gate which receives the digital signal received by the input means, wherein the first transistor has a predetermined ON conductivity and the transistor is conductive when its gate is at the second logic level; and the first and second means for discharging each includes a second transistor having a source connected to the ground rail, a drain, and a gate connected to receive the digital signal received by the input means, wherein when the gate of the second transistor is at the first logic level the second transistor has the same predetermined ON conductivity as the first transistor when the gate of the first transistor is at the second logic level; and a third transistor having a source connected to the drain of the second transistor, a drain connected to the drain of the first transistor and to the capacitor means, and a gate connected to the power supply rail, and further wherein the third transistor has an ON conductivity which is substantially less than the ON conductivity of the first and second transistors.

9. The apparatus of claim 7 wherein the first and second sinking means each comprise a transistor having a gate connected to their respective capacitor means.

10. The apparatus of claim 3, wherein the second predetermined amount of time, $\tau_2$, corresponds to the amount of propagation delay between an input and an output of a specified electronic circuit, and further wherein the second predetermined amount of time is provided by an electronic circuit which is a replica of the specified electronic circuit and which has an input and an output so that the propagation delay between the input and the output of the replicated electronic circuit corresponds to the amount of propagation delay of the specified electronic circuit, and further wherein the input of the replicated electronic circuit is the input of the second delay means and the output of the replicated electronic circuit is the output of the second delay means.

11. The apparatus of claim 3 wherein the first means for comparing comprise an exclusive-OR logic gate.

12. The apparatus of claim 4 wherein the first means for comparing comprise an AND logic gate.

13. The apparatus of claim 11, wherein the second means for comparing comprises an AND logic gate.

14. The apparatus of claim 6, wherein the second predetermined amount of time, $\tau_2$, corresponds to the amount of propagation delay between an input and an output of a specified electronic circuit, and further wherein the second predetermined amount of time is provided by electronic circuit which is a replica of the specified electronic circuit and which has an input and an output so that the propagation delay between the input and the output of the replicated electronic circuit corresponds to the amount of propagation delay of the specified electronic circuit, and further wherein the input of the replicated electronic circuit is the input of the second delay means and the output of the replicated electronic circuit is the output of the second delay means.

15. An apparatus for detecting a transition between logic states in a digital signal comprising input means receiving the digital signal for generating a first pulse having a first predetermined pulsewidth when a transition occurs in the digital signal; and output means responsive to the first pulse from the input means for generating a second pulse having a second predetermined pulsewidth which is less than the first predetermined pulsewidth, comprising delay means for providing an output which is a version of the first pulse from the input means which has been delayed by a predetermined amount of time which is less than the predetermined pulsewidth of the first pulse wherein the predetermined amount of time corresponds to the amount of propagation delay between an input and an output of a specified electronic circuit, and further wherein the second predetermined amount of time is provided by an electronic circuit which is a replica of the specified electronic circuit and which has an input and an output so that the propagation delay between the input and the output of the replicated electronic circuit corresponds to the amount of propagation delay of the specified electronic circuit, and further wherein the input of the replicated electronic circuit is the input of the second delay means and the output of the replicated electronic circuit is the output of the second delay means; and means for comparing the first pulse from the input means to the output of the delay means, and for providing the first output logic state when the output and the first pulse from the input means are the same, and a second output logic state when they are different.

16. The apparatus of claim 10, wherein the second means for comparing comprises an AND logic gate.

17. An apparatus for detecting a transition between logic states in a digital signal comprising input means receiving the digital signal for generating a first pulse which has a first predetermined pulsewidth when a transition occurs in the digital signal, wherein the input means comprise first delay means for providing an output which changes state from a first logic state to a second logic state a first predetermined amount of time, $\tau_1$, after receipt of a rising edge in the digital signal received by the input means, and which changes state from the second logic state to the first logic state without delay upon receipt of a falling edge in the digital signal received by the input means;

second delay means for providing an output which changes state from the second logic state to the first logic state the first predetermined amount of time after receipt of a falling edge in the digital signal received by the input means, and which changes state from the first logic state to the second logic state without delay upon receipt of a rising edge in the digital signal received by the input means; and first means for comparing the outputs of the first and second delay means, and for providing a first output logic state when both outputs are the same predetermined logic state, and a second output logic state when either or both of the outputs are at a logic state different than the predetermined logic state; and output means responsive to the first pulse from the input means for generating a second pulse having a second predetermined pulsewidth which is less than the first predetermined pulsewidth.

18. The apparatus of claim 12, wherein the first delay means each include first capacitor means for storing charge;

first means connected to the capacitor means and responsive to the digital signal received by the input means for charging the capacitor means when the digital signal received by the input means is in the second logic state;

first means connected to the capacitor means and responsive to the digital signal received by the input means for discharging the capacitor means when the digital signal received by the input means is in the first logic state.

19. The apparatus of claim 18, wherein the second delay means each include means receiving the digital signal received by the input means for providing an inverted version of the digital signal received by the input means;

second capacitor means for storing charge;

second means connected to the capacitor means and responsive to the inverted version of the digital signal received by the input means for discharging the capacitor means when the inverted version of the digital signal received by the input means is in the second logic state;

second means connected to the capacitor means and responsive to the inverted version of the digital signal received by the input means for charging the capacitor means with a predetermined time constant when the inverted version of the digital signal received by the input means is in the first logic state.

20. The apparatus of claim 19, wherein the first means for comparing includes first means coupled to the first capacitor means of the first delay means for sinking current from an output node when the first capacitor means is charged above a predetermined voltage; and second means coupled to the second capacitor means of the second delay means for sinking current from the first current sinking means when the second capacitor means is charged above a predetermined voltage, so that both the first and second means for sinking current must be operative before current will flow into the output node.

21. The apparatus of claim 19 wherein the apparatus has a power supply rail and a ground rail, and further wherein the first and second means for charging each comprise a first transistor having a source connected to the power supply rail, a drain, and a gate which receives the digital signal received by the input means, wherein the first transistor has a predetermined ON conductivity and the transistor is conductive when its gate is at the second logic level; and the first and second means for discharging each includes
a second transistor having a source connected to the ground rail, a drain, and a gate connected to receive the digital signal received by the input means, wherein when the gate of the second transistor is at the first logic level the second transistor has the same predetermined ON conductivity as the first transistor when the gate of the first transistor is at the second logic level; and
a third transistor having a source connected to the drain of the second transistor, a drain connected to the drain of the first transistor and to the capacitor means, and a gate connected to the power supply rail, and further wherein the third transistor has an ON conductivity which is substantially less than the ON conductivity of the first and second transistors.

22. The apparatus of claim 20 wherein the first and second sinking means each comprise a transistor having a gate connected to their respective capacitor means.

23. The apparatus of claim 17 wherein the first means for comparing comprise an AND logic gate.

24. The apparatus of claim 19, wherein the second predetermined amount of time, $\tau_2$, corresponds to the amount of propagation delay between an input and an output of a specified electronic circuit, and further wherein the second predetermined amount of time is provided by an electronic circuit which is a duplicate of the specified electronic circuit and which has an input and an output so that the propagation delay between the input and the output of the duplicate electronic circuit corresponds to the amount of propagation delay of the specified electronic circuit, and further wherein the input of the duplicate electronic circuit is the input of the second delay means and the output of the duplicate electronic circuit is the output of the second delay means.

* * * * *

UNITED STATES PATENT AND TRADEMARK OFFICE
CERTIFICATE OF CORRECTION

PATENT NO. : 5,465,062
DATED : Nov. 7, 1995
INVENTOR(S) : Vincent L. Fong

It is certified that error appears in the above-indentified patent and that said Letters Patent is hereby corrected as shown below:

Column 2, Line 3, change "the." to --the--

Column 3, Line 57, change "42" to --22 (waveform 42)--

Column 4, Line 1, change "38" to --16 (waveform 38)--

Column 5, Line 7, change "103 to --104--

Column 6, Line 27, change "M25" to --M27--

Column 8, Line 30, change "T" to --T2--

Column 8, Line 37, change "off,he" to --of the--

Signed and Sealed this

Tenth Day of September, 1996

Attest:

BRUCE LEHMAN

Attesting Officer

Commissioner of Patents and Trademarks